US006239645B1

United States Patent
Tsukahara et al.

(10) Patent No.: US 6,239,645 B1
(45) Date of Patent: May 29, 2001

(54) COMPLEMENTARY TUNED MIXER

(75) Inventors: Tsuneo Tsukahara; Mitsuru Harada, both of Kanagawa (JP)

(73) Assignee: Nippon Telegraph & Telephone Corporation, Tokyo (JP)

( * ) Notice: Subject to any disclaimer, the term of this patent is extended or adjusted under 35 U.S.C. 154(b) by 0 days.

(21) Appl. No.: 09/382,123

(22) Filed: Aug. 24, 1999

(30) Foreign Application Priority Data

Aug. 26, 1998 (JP) .................................................. 10-240018

(51) Int. Cl.⁷ ........................................................ G06G 7/16
(52) U.S. Cl. ............................................ 327/359; 327/356
(58) Field of Search .................................... 327/356, 355, 327/359, 357, 361, 52, 65, 77, 78; 455/326, 333

(56) References Cited

U.S. PATENT DOCUMENTS

| 5,495,194 | * | 2/1996 | Sugawara | 327/355 |
| 5,570,056 | | 10/1996 | Groe | 327/359 |
| 5,686,870 | | 11/1997 | Ariie | 332/168 |
| 5,901,350 | * | 5/1999 | Stoichita et al. | 327/359 |
| 5,949,285 | * | 9/1999 | Ando | 327/359 |
| 6,094,084 | * | 7/2000 | Abou-Allam et al. | 327/359 |

FOREIGN PATENT DOCUMENTS 0 714 163 A1   5/1996   (EP) .

OTHER PUBLICATIONS

"A 20–V Four–Quadrant CMOS Analog Multiplier", Babanezhad et al, *IEEE Journal of Solid–State Circuits*, vol. SC–20, No. 6, Dec. 1985, pp. 1158–1168.

"A CMOS RF–Reciever Front–End for 1 GHz Applications", Stubbe et al, *1998 Symposium on VLSI Circuits Digest of Technical Papers*, pp. 80–83.

"A 1.5v 900MHZ Downconversion Mixer", Razavi, *IEEE International Solid State Circuits Conference*, vol. 39, pp. 48–49. Feb., 1996.

"A GaAs Single Balanced Mixer MMIC with Built–in Active Balun for Personal Communication Systems", Koizumi et al, *IEEE Microwave and Millimeter–Wave Monolithic Circuits Symposium*, pp. 77–80. May, 1995.

* cited by examiner

*Primary Examiner*—Toan Tran
*Assistant Examiner*—Linh Nguyen
(74) *Attorney, Agent, or Firm*—Arent, Fox, Kintner Plotkin Kahn PLLC

(57) ABSTRACT

A mixer circuit for frequency conversion operates with low power supply voltage lower than 1 V. The circuit comprises a first pair of N-channel MOS transistors and a second pair of N-channel MOS transistors each receiving differential local frequency signal, and a third pair of P-channel MOS transistors receiving differential radio frequency signal. Each pair of transistors is coupled in series with a parallel resonance circuit which operates as a constant current source. A drain of each transistor of the third pair of transistors is connected to a junction of a first pair and a second pair of transistors and a parallel resonance circuit. An output intermediate frequency signal, which differs between the local frequency and the radio frequency, is obtained at the junction of drains of the first and the second pair of transistors and load resistors. No series connected transistor is inserted between a power source and a ground, and each pair of transistors is inserted between the power source and the ground essentially in parallel with one another.

10 Claims, 8 Drawing Sheets

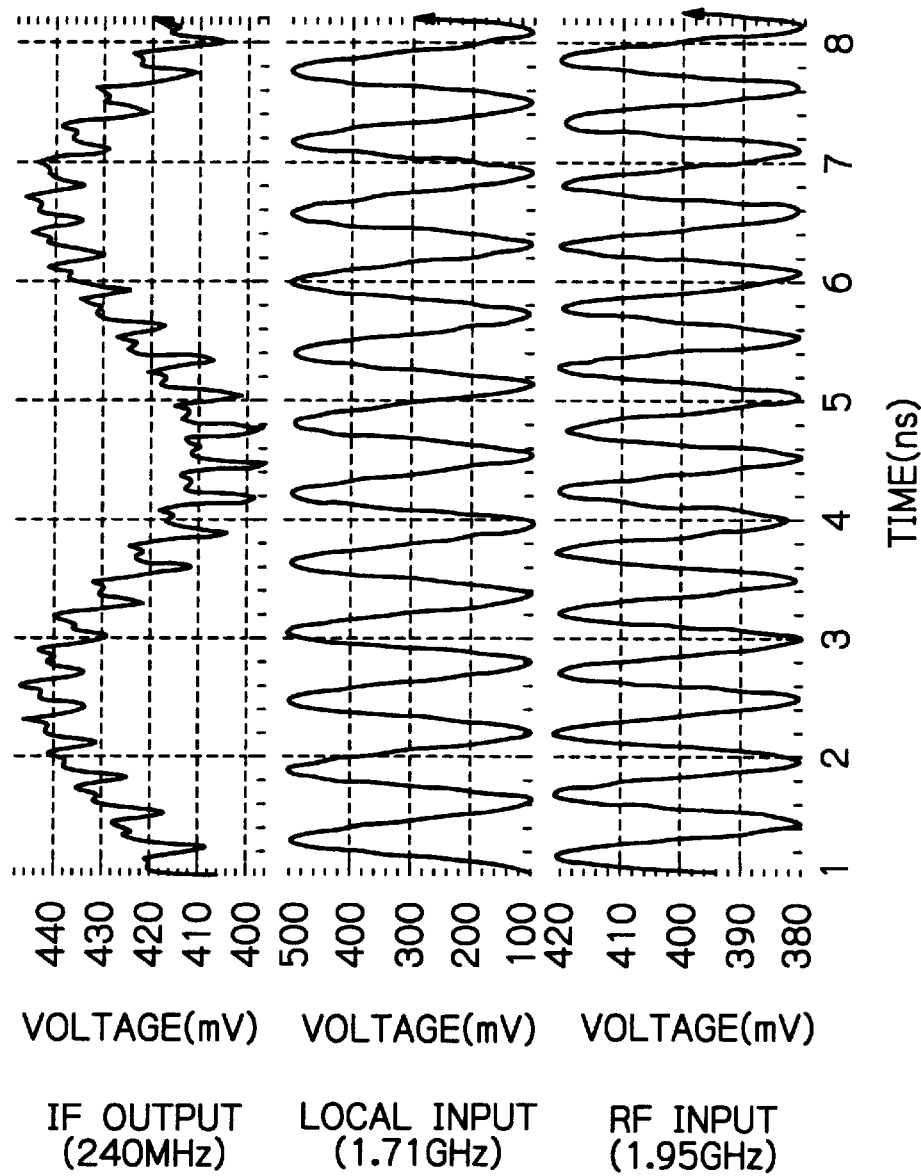

COMPLEMENTARY TUNED MIXER

BACKGROUND OF THE INVENTION

The present invention relates to a mixer circuit used for frequency conversion of carrier frequency in radio communication system.

A mixer circuit is used for frequency conversion in a radio transceiver. A mixer circuit operates to multiply two analog signals for frequency conversion. A Gilbert cell type mixer circuit has been known for an integrated mixer circuit.

FIG. 8 shows a prior Gilbert cell type mixer circuit which used MOSFET elements. The symbols MN1 and MN2 show N-channel MOS transistors constituting a first differential pair 1. A gate of those transistors accepts local frequency signals LO (LO+, LO−) in differential form. The symbols MN3 and MN4 are N-channel MOS transistors constituting a second pair 2, having a gate similarly accepting local frequency signals LO (LO+, LO−). The symbols MN5 and MN6 are N-channel MOS transistors constituting a third pair 3A. Each gate of those transistors accepts high frequency signal RF (RF+ and RF−) in differential form, respectively. The symbol MN7 is an N-channel MOS transistor which operates as a current source. The symbols RL1 and RL2 are a load resistor common to the first pair 1 and the second pair 2.

In the Gilbert cell type mixer circuit in FIG. 8, the transistors MN5 and MN6 converts high frequency signal RF into differential current form, and each of the transistors MN1 through MN4 switches said current according to the local frequency signal LO, so that the product of the high frequency signal RF and the local frequency signal LO is obtained at one terminal of the loads RL1 and RL2 to provide intermediate frequency signal IF (IF+, IF−) in differential form.

By the way, a wireless transceiver operates with a battery, and it is preferable that voltage of the battery is as low as possible in view of small size and light weight of a transceiver.

However, the prior Gilbert cell type mixer circuit must have power supply voltage VDD at least 1.5–2.0 V, since the prior Gilbert cell type mixer circuit must have three stacks of transistors (MN1, MN5 and MN7), or (MN3, MN6 and MN7) et al.

If we try to decrease power supply voltage, high frequency operation is difficult since drain junction capacitance of a transistor increases, therefore, no application to wireless communication is possible.

As mentioned above, as the operation with low power supply voltage less than 1.5 V is impossible, a prior transceiver must have more than two series connected batteries each of which may be a primary battery (1.5 V) or a NiCd type secondary battery (1.2 V). Thus, small sized and/or light weight transceiver has been difficult because of the use of two series connected batteries.

SUMMARY OF THE INVENTION

It is an object of the present invention, therefore, to provide a new and improved tuned mixer by overcoming the disadvantages and limitations of a prior tuned mixer.

It is an object of the present invention to provide a tuned mixer which operates with power supply voltage lower than 1.0 V.

The above and other objects are attained by a complementary tuned mixer circuit comprising; a first series circuit having a first pair of differentially arranged transistors receiving a first multiply signal in differential form, and an impedance circuit which operates as a constant current source; a second series circuit of the similar configuration to said first series circuit; a differential amplifier receiving a second multiply signal and providing a pair of outputs in differential form; said first series circuit and said second series circuit being inserted between a first power terminal (VDD) and a second power terminal, respectively through a respective load resistor (RL1, RL2); said differential amplifiers being supplied directly by said first power terminal (VDD), and each outputs in differential form being coupled with a junction of said impedance circuit and transistors in said first series circuit and a junction of said impedance circuit and transistors in said second series circuit, respectively; and a product, in differential form, of said first multiply signal and said second multiply signal being obtained at junction of said load resistors and said series circuits.

The transistors composing said first series circuit and said second series circuit have opposite conductivity type to that of the transistors composing said differential amplifier.

Said differential amplifier has differential transistor pair which receive the second multiply signal, and an impedance circuit which operates as a constant current source, each connected in series with said differential amplifier, between the first power supply terminal and the second power supply terminal.

Preferably, said differential amplifier has a pair of capacitors in coupling lines between output lines of the differential amplifier and said series circuits to cut off D.C. current.

When said capacitors are provided in said coupling lines, transistors in the first and the second series circuits may have the same conductivity type as that of transistors in the differential amplifier.

Preferably, said impedance circuit is a parallel resonance circuit having an inductor and a capacitor, and resonating with said first multiply signal or said second multiply signal. As the first multiply signal frequency is in general close to the second multiply signal frequency, when the resonance circuit resonates with one of the multiply signal frequencies, it may have enough impedance to operate as a constant current source for both the multiply signals. When the value Q of the parallel resonance circuit is too high, a resistor is coupled with the resonance circuit in parallel to decrease the value Q. As an impedance circuit has high impedance for high frequency so that it operates as a constant current source, and low resistance for D.C. current so that high D.C. voltage is applied to transistors, it may not necessarily a parallel resonance circuit, but a mere inductor is enough.

BRIEF DESCRIPTION OF THE DRAWINGS

The foregoing and other objects, features, and attendant advantages of the invention will be well understood by means of the following description and accompanying drawings, wherein;

FIG. 3 shows simulated waveforms of the apparatus of FIG. 1.

DESCRIPTION OF THE PREFERRED EMBODIMENTS (First embodiment)

Figure 1:
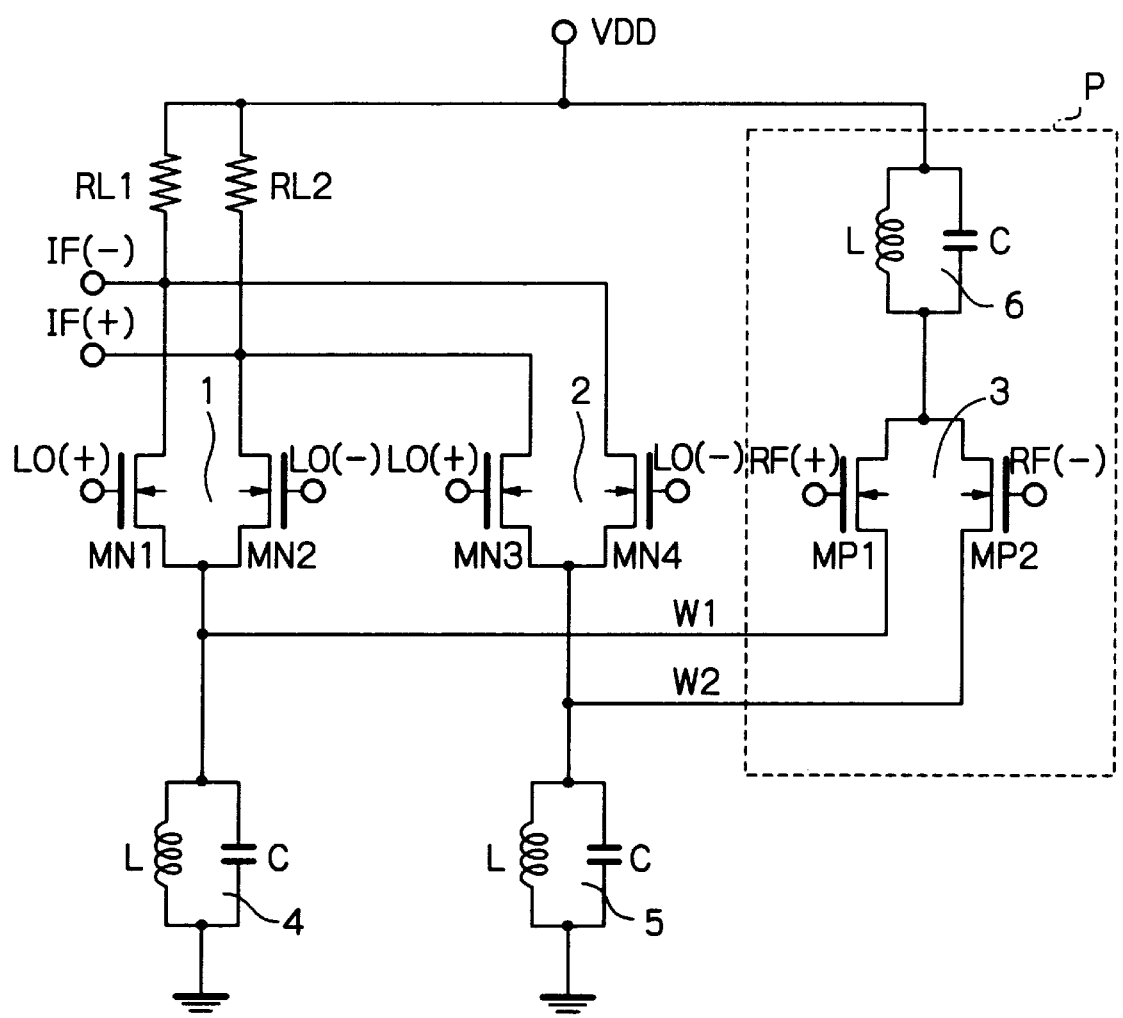
FIG. 1 is a circuit diagram of a frequency mixer according to the present invention.

FIG. 1 is a circuit diagram of a frequency mixer according to the present invention. The same numerals are assigned in FIG. 1 for the same members as those in FIG. 8.

In FIG. 1, a first differential pair 1 comprises a pair of transistors MN1 and MN2 which receive differential local frequency signals LO+ and LO− on each gate. A current supply terminal (source) of those transistors is coupled with a power source (ground) through a parallel resonance circuit 4 having an inductor L and a capacitor C.

Similarly, a second differential pair 2 comprises a pair of transistors MN3 and MN4 which receive differential local frequency signals LO+ and LO− on each gate. A current supply terminal (source) of those transistors is coupled with a power source (ground) through a parallel resonance circuit 5 having an inductor L and a capacitor C.

A third differential pair 3 comprises a pair of P-channel MOS transistors MP1 and MP2 which receive differential high frequency signals RF+ and RF− on each gate. A current supply terminal (source) of those transistors is coupled with a power source (VDD) through a parallel resonance circuit 6 having an inductor L and a capacitor C. Drains (outputs) of those transistors are connected to each current supply terminal (source) of the transistors of the first pair and the second pair, respectively.

A load RL1 is connected to a drain of a non-inverted transistor MN1 (which receives one (+) of the differential local signals) of the first pair 1 and a drain of an inverted transistor MN4 (which receives one (−) of the differential local signals) of the second pair 2. A load RL2 is connected to a drain of an inverted transistor MN2 of the first pair 1 and a drain of a non-inverted transistor MN3 of the second pair 2.

Figure 2A:
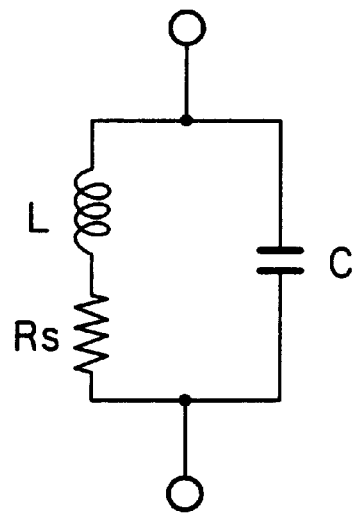
FIG. 2a is an equivalent circuit of a parallel resonant circuit.
Figure 2B:
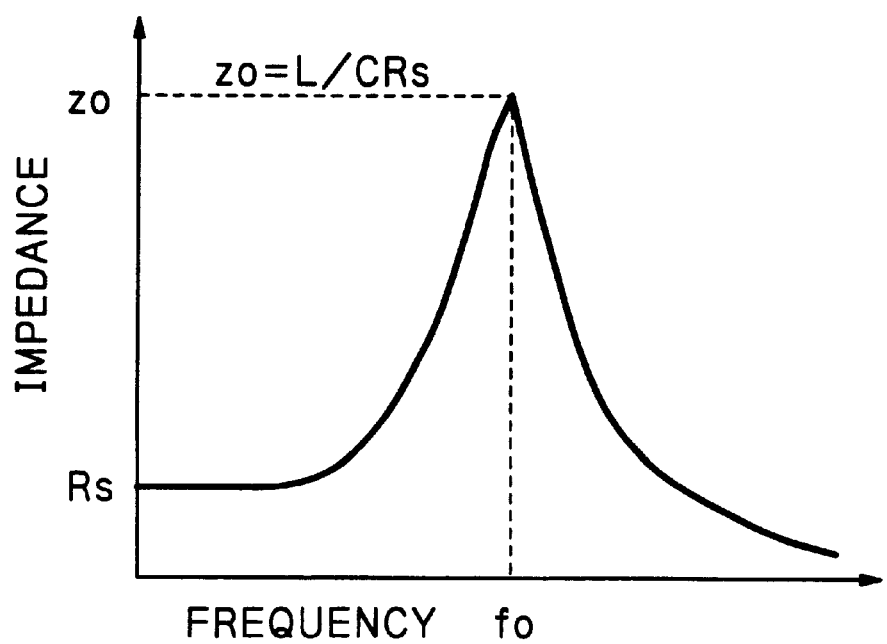
FIG. 2B shows the impedance characteristics of the same.

Each of the resonance circuits 4 through 6 are equivalent to the circuit of FIG. 2(*a*), which has a capacitor C, and a series circuit of an inductor L and a resistor Rs. The frequency-impedance characteristics of a parallel resonance circuit is shown in FIG. 2(*b*), which has the maximum impedance $z_0 = L/CRs = RsQ^2$ at the resonance frequency $f_0 = \frac{1}{2}\pi(LC)^{1/2}$, where Q is a value showing how sharp a resonance circuit is.

It should be noted that a parallel resonance circuit has high impedance at resonance frequency $f_0$, therefore, a parallel resonance circuit is equivalent to a current source for alternate (AC) signal. A parallel resonance circuit has small resistance for DC signal. That small resistance provides small voltage drop, which does not much affect to the operation of the present invention.

Figure 8:
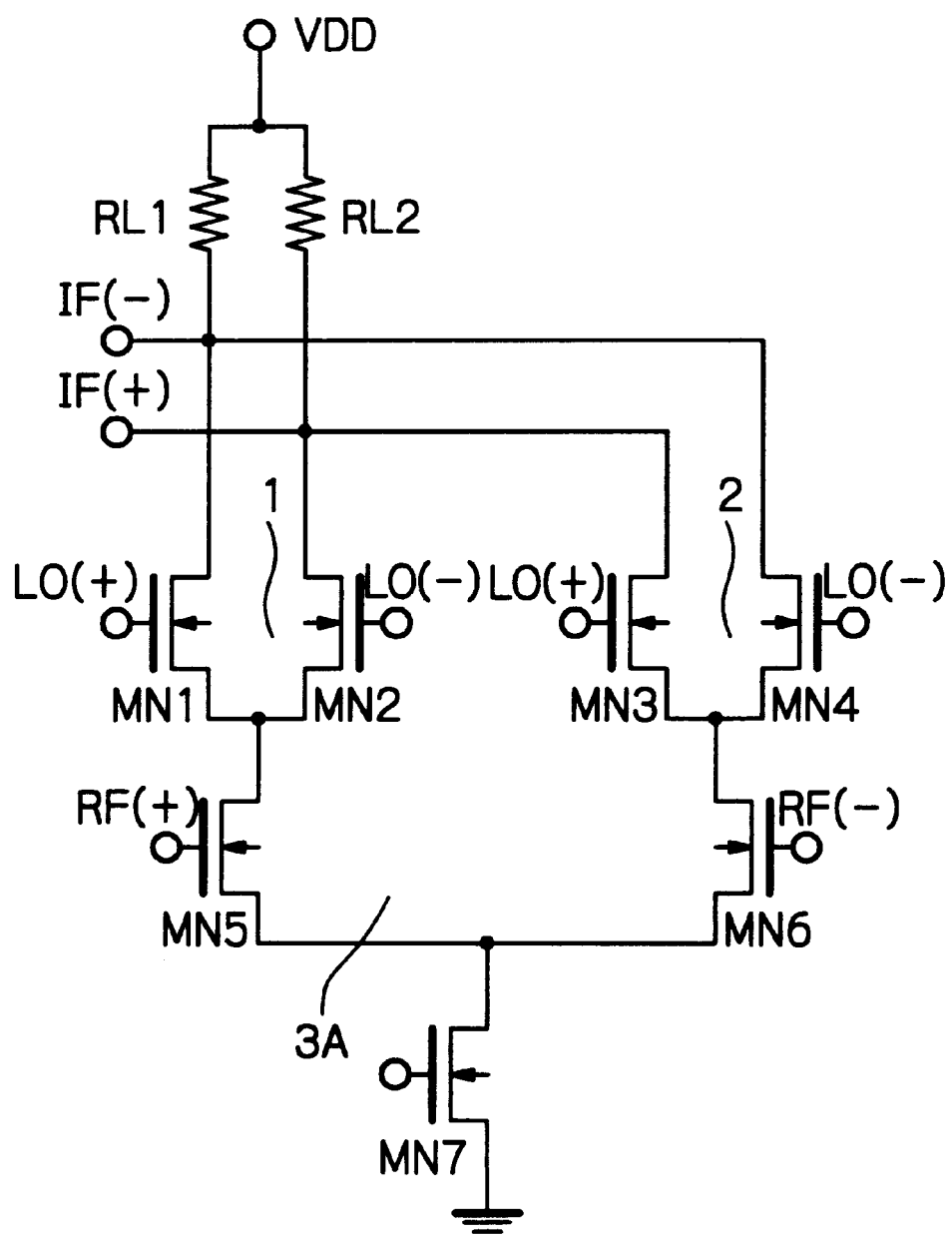
FIG. 8 is a circuit diagram of a prior frequency mixer.

As compared with a prior art of FIG. 8, the first differential pair 1, the second differential pair 2 and the third differential pair 3 are inserted essentially in parallel between the power supply terminal VDD and the ground. The signal transfer between the first pair 1 or the second pair 2, and the third pair 3 is carried out through resonance circuits 1 and 2 which operate as a constant current source. It should be noted that the total current in the transistors MN1, MN2 and MP3 is almost constant because of the presence of the parallel resonance circuit 4 which operates as a constant current source. Similarly, the total current in the transistors MN3, MN4 and MP2 is almost constant, and the total current in the transistors MP1 and MP2 is almost constant. For instance, when drain current of the transistor MP1 of the third pair 3 increases by the high frequency signal RF+, the current in the first differential pair 1 decreases, and therefore, the high frequency signal RF is transferred to the first pair 1.

It should be appreciated that the total current in the first differential pair 1 (MN1 and MN2), and the transistor MP1 is constant because of the presence of the current source 4, the total current in the second differential pair 2 (MN3 and MN4) and the transistor MP2 is constant because of the presence of the current source 5. And, the total current in the transistors MP1 and MP2 is constant because of the presence of the current source 6.

The voltage between a gate and a source of the third differential pair 3 is almost equal to the voltage between the power source voltage VDD and the high frequency signal (RF+, RF−), as the D.C. voltage drop in the parallel resonance circuit 6 is almost zero. That voltage determines bias current of the transistors.

Similarly, the voltage between a gate and a source in the first differential pair 1 and the second differential pair 2 is determined by the voltage between the local frequency signal (LO+, LO−) and the ground.

Therefore, bias voltage may be set arbitrarily and a circuit itself can operate with low power supply voltage.

FIG. 3 shows simulated waveforms of the device of FIG. 1, in which a computer program HSPICE was used. In FIG. 3, the power supply voltage VDD is 1 V, the local frequency signal LO is 1.71 GHz, the radio frequency signal RF is 1.95 GHz, and an output intermediate frequency is 240 MHz. A lowpass filter is used to process the intermediate frequency so that the difference frequency component (240 MHz) is clarified.

As described above, according to the present invention, no series connection of transistors between power supply terminals is necessary, and therefore, a frequency mixer can operate with low voltage less than 1 V.

(Second embodiment)

Figure 4:
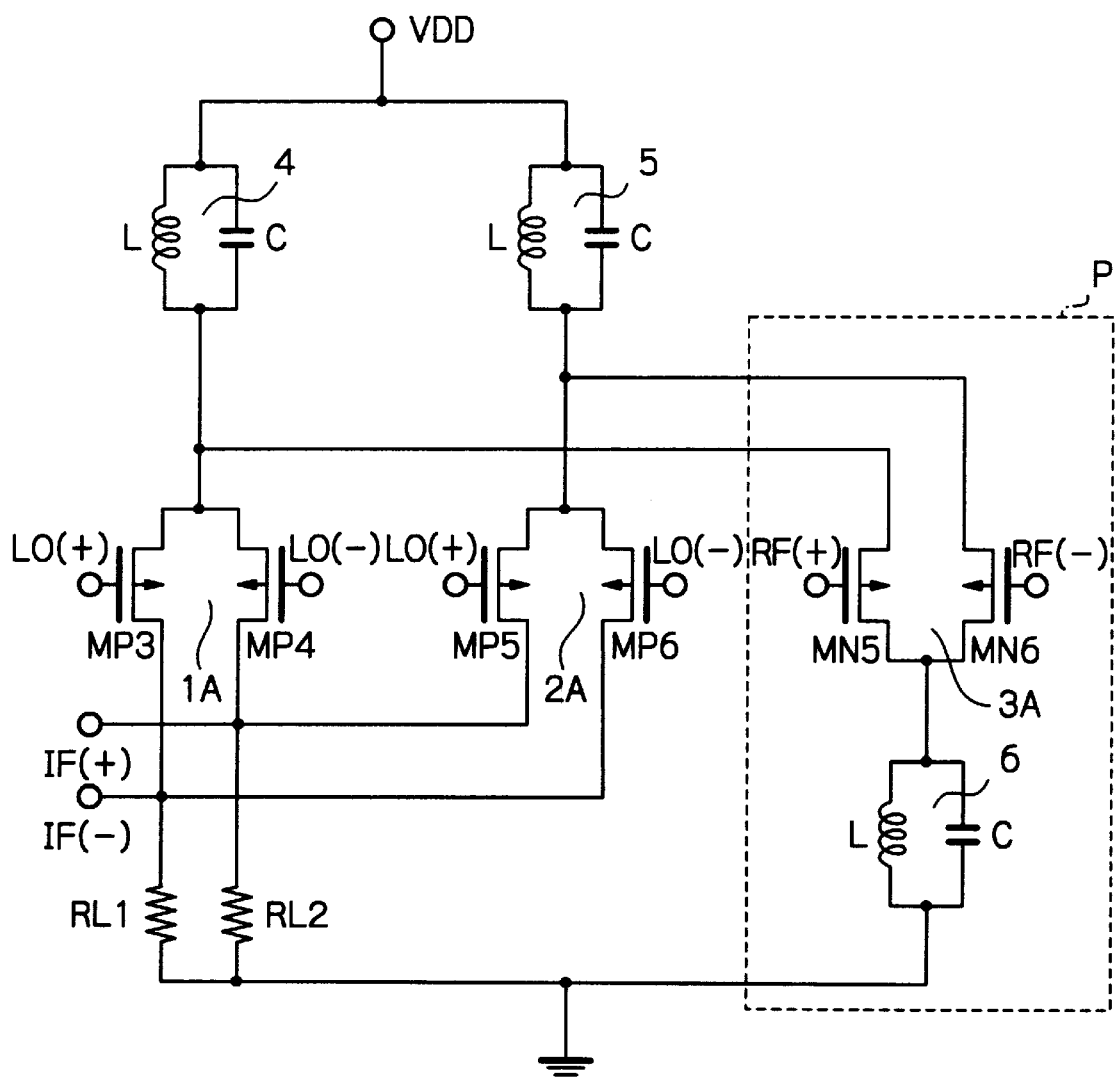
FIG. 4 is a circuit diagram of another embodiment of a frequency mixer according to the present invention.

FIG. 4 shows a circuit diagram of a second embodiment of a frequency mixer according to the present invention.

The feature of FIG. 4 as compared with the embodiment of FIG. 1 is that a N-channel MOS transistor in FIG. 1 is changed to a P-channel MOS transistor in FIG. 4, and a P-channel MOS transistor in FIG. 1 is changed to a N-channel MOS transistor in FIG. 4. The first differential pair 1 and the second differential pair 2 in FIG. 1 which receive differential local frequency signal are changed to the first differential pair 1A and the second differential pair 2A which have P-channel MOS transistors MP3 through MP6, and the third differential pair 3 in FIG. 1 is changed to the third differential pair 3A having N-channel MOS transistors MN5 and MN6. The relation of the power source VDD and the ground in view of the transistors is opposite to that of FIG. 1, and the parallel resonance circuits 4 through 6 are connected to a source of a respective differential pair of transistors, and the load resistors RL1 and RL2 are connected to a drain of a respective transistor.

(Third embodiment)

Figure 5:
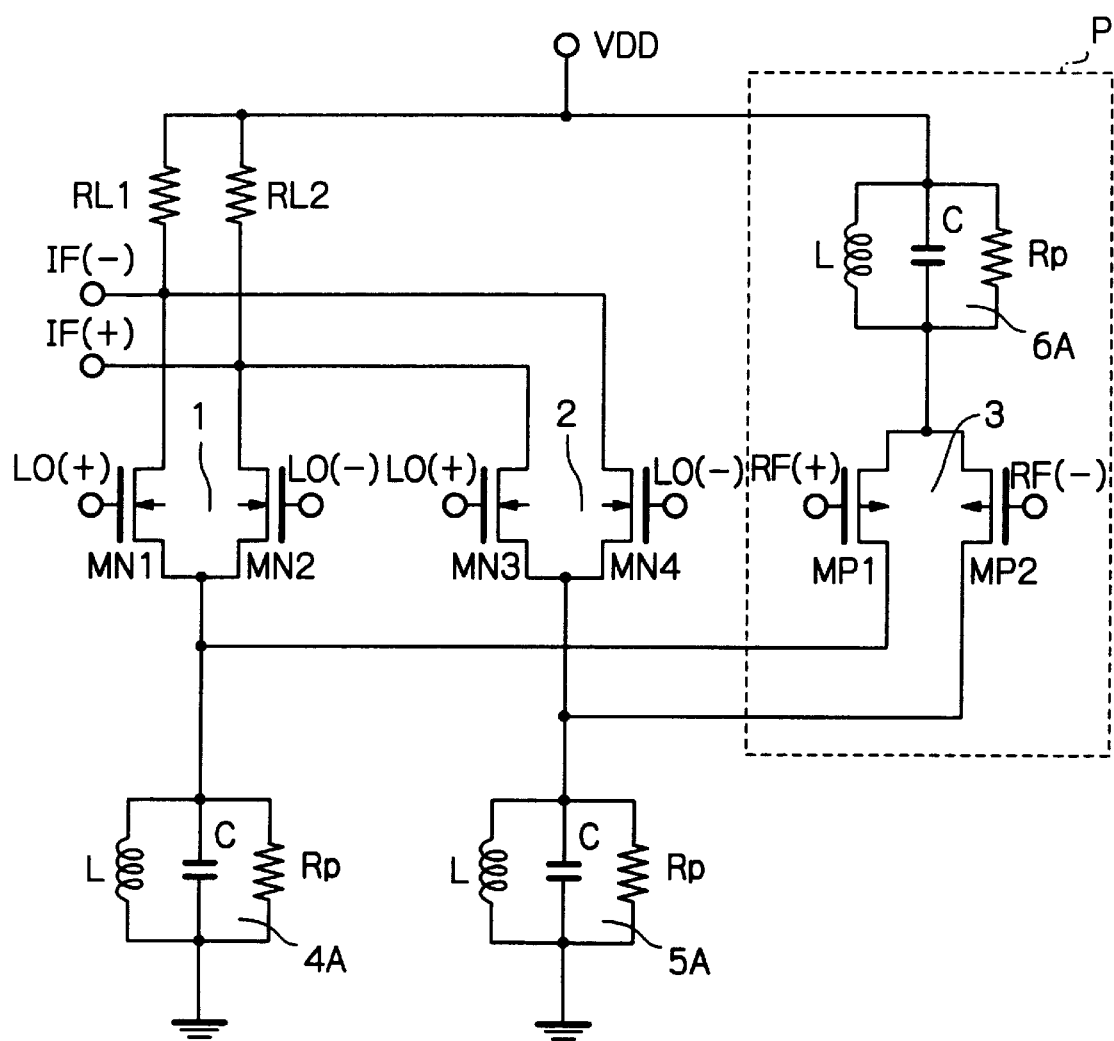
FIG. 5 is a circuit diagram of still another embodiment of a frequency mixer according to the present invention.

FIG. 5 is a circuit diagram of the third embodiment of a frequency mixer according to the present invention. The feature of the embodiment of FIG. 5 is that parallel resonance circuits 4A through 6A have a resistor Rp coupled with each of parallel resonance circuits 4–6 of FIG. 1, in parallel.

When the value Q is too high in a parallel resonance circuit, the impedance of the parallel resonance circuit is sensitive in view of the frequency change. Therefore, the resistor Rp which satisfies $z_0$=L/CRs>Rp is coupled with a parallel resonance circuit in parallel to decrease the value Q, so that the circuit may be designed easily. It should be note that no voltage drop for D.C. current occurs in the parallel resonance circuit of FIG. 5.

(Fourth embodiment)

Figure 6:
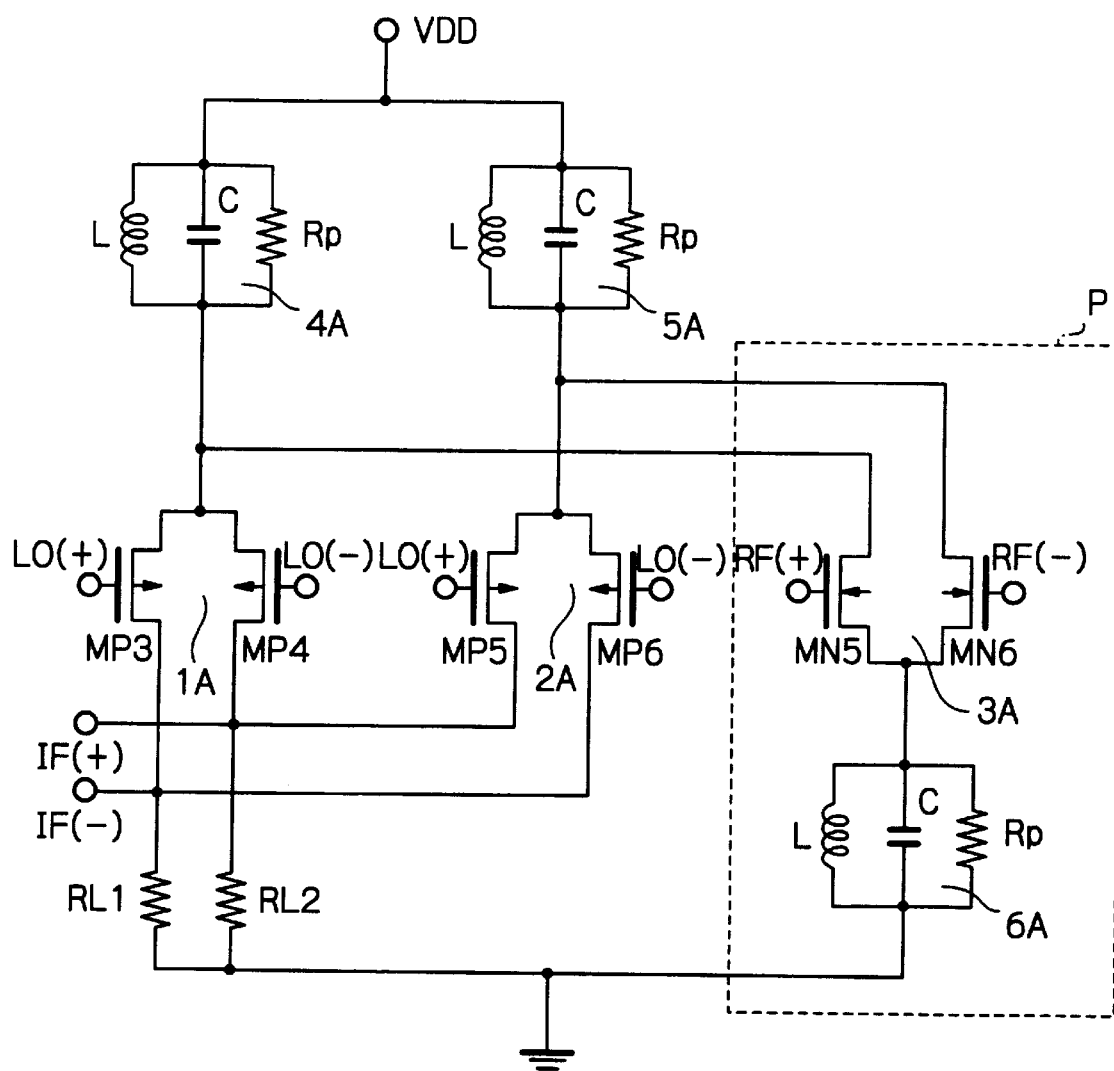
FIG. 6 is a circuit diagram of still another embodiment of a frequency mixer according to the present invention.

FIG. 6 is a circuit diagram of the fourth embodiment of a frequency mixer according to the present invention. The feature of the embodiment of FIG. 6 is that parallel resonance circuits 4A through 6A have a resistor Rp coupled with each of parallel resonance circuits 4–6 of FIG. 4. The circuit of FIG. 6 has the advantage similar to that of FIG. 5.

(Another embodiment)

In the above embodiments, although an FET (Field Effect Transistor) is used, it is possible to use a bipolar transistor. In that case, a drain, a gate and a source of an FET corresponds to a collector, base and an emitter, respectively, and a P-channel MOS transistor is replaced by an NPN transistor, and a N-channel MOS transistor is replaced by a PNP transistor.

Figure 7A:
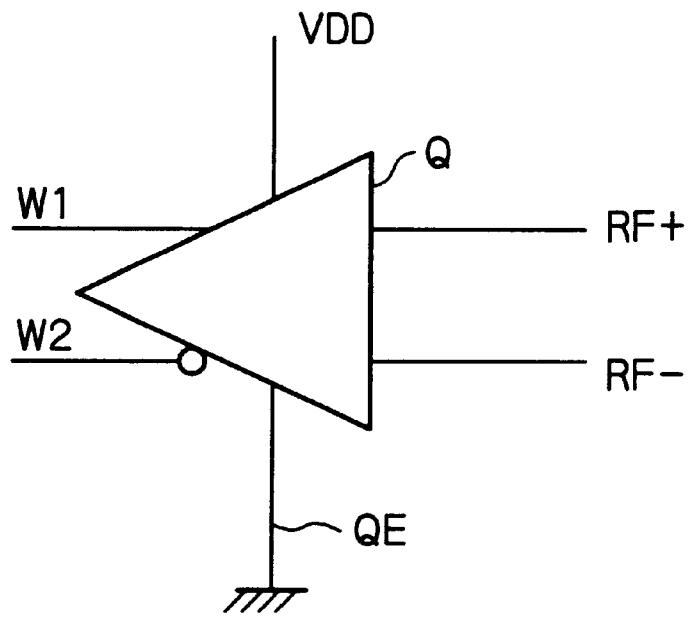
FIGS. 7A and 7B show a differential amplifier used in each embodiments.

It should be noted in the embodiments in FIGS. 1, 4, 5 and 6 that the operation by the circuit P enclosed by the dotted line is equivalent with a differential amplifier Q in FIG. 7A, and the circuit P may be replaced by a differential amplifier. A differential amplifier Q receives, in the embodiment of FIG. 1, radio frequency signal RF+ and RF−, and provides differential outputs W1 and W2 to the transistor pairs (MN1, MN2) and (MN3, MN4). A differential amplifier Q is inserted between a power supply terminal VDD and ground. It should be noted that the ground line of the differential amplifier Q is provided by the impedance circuits 4 and 5 through the output lines W1 and W2 in the embodiments of FIGS. 1 and 5, and by the ground line QE in the embodiments of FIGS. 4 and 6.

Figure 7B:
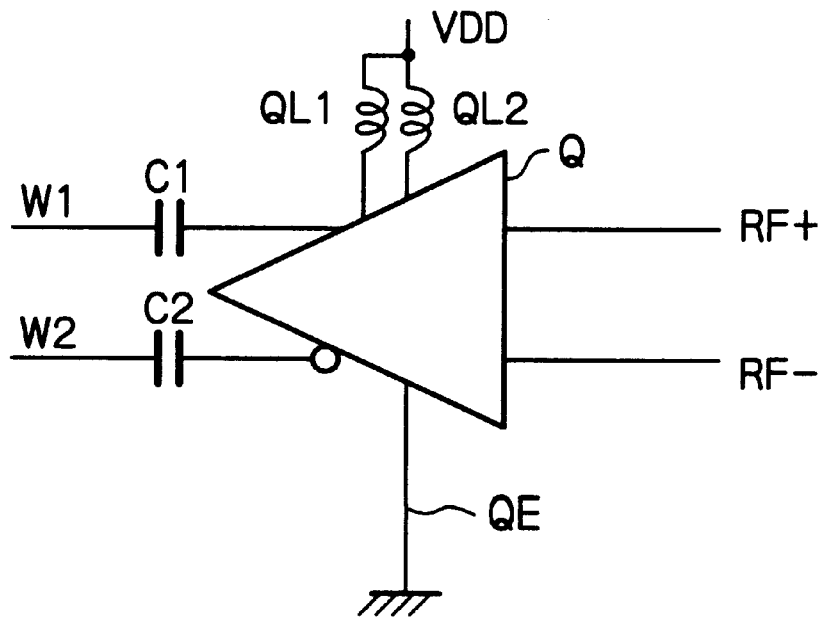

Further, the output lines W1 and W2 may have capacitors C1 and C2 respectively in series in each output lines as shown in FIG. 7B, so that DC current is prevented by the capacitors. In that case, inductors QL1, QL2 which are a load should be inserted between the power supply terminal VDD and the differential amplifier Q. When the capacitors C1 and C2 are inserted, the conductivity type of transistors composing a differential amplifier Q may the the same as the conductivity type of transistors (MN1, MN2, MN3, MN4) which receive local frequency signal. The application of the structure of FIG. 7B to each of the embodiments of FIGS. 1, 4, 5 and 6, and the selection of the conductivity type of transistors (P-channel, or N-channel) are obvious to those skilled in the art.

(Effect of the invention)

As described above in detail, the present invention uses a current source implemented by a parallel resonance circuit, instead of a current source implemented by a transistor in a prior art. Therefore, transistors are not connected in series between two power supply terminals. The circuit can operate with power supply voltage which is requested to operate one stage of a transistor, and therefore, the circuit can operate with low voltage around 1 V.

Further, when a resistor is coupled with a parallel resonance circuit in parallel, the impedance of the parallel resonance circuit is less sensitive to frequency, and the circuit design is easy.

From the foregoing, it will now be apparent that a new and improved frequency mixer has been found. It should be appreciated of course that the embodiments disclosed are merely illustrative and are not intended to limit the scope of the invention. Reference should be made to the appended claims, therefore, for indicating the scope of the invention.

What is claimed is:

1. A complementary mixer circuit comprising:
   a first series circuit having a first pair of differentially arranged transistors receiving a first multiply signal in differential form, and an impedance circuit which operates as a constant current source,
   a second series circuit of similar configuration to said first series circuit,
   a differential amplifier receiving a second multiply signal and providing a pair of outputs in differential form,
   said first series circuit and said second series circuit being inserted between a first power terminal and a second power terminal respectively through a respective load resistor,
   said differential amplifier being supplied directly by said first power terminal, and each output in differential form is coupled with a junction of transistors and the impedance circuit in said first series circuit and a junction of transistors and the impedance circuit in said second series circuit, respectively,
   a product, in differential form, of said first multiply signal and said second multiply signal being obtained at a junction of said load resistors and said series circuits.

2. A complementary mixer circuit according to claim 1, wherein said differential amplifier comprises a series circuit of a pair of transistors in differential form receiving said second multiply signal and an impedance circuit which operates as a constant current source, inserted between said first power terminal and said second power terminal.

3. A complementary mixer circuit according to claim 1, wherein each output lines of said differential amplifier are provided a respective capacitor which prevents D.C. current.

4. A complementary mixer circuit according to claim 1, wherein said impedance circuit is a parallel resonance circuit having an inductor and a capacitor, and resonate with said first multiply signal or said second multiply signal.

5. A complementary mixer circuit according to claim 1, wherein said impedance circuit is composed of an inductor.

6. A complementary mixer circuit according to claim 4, wherein said parallel resonance circuit is provided with a resistor coupled in parallel with said resonance circuit.

7. A complementary mixer circuit according to claim 3, wherein transistors composing said first series circuit and said second series circuit are in different conductivity type from that of transistors composing said differential amplifier.

8. A complementary mixer circuit according to claim 2, wherein transistors composing said first series circuit and said second series circuit comprise N-channel MOS transistors, and transistors composing said differential amplifier comprise P-channel MOS transistors.

9. A complementary mixer circuit according to claim 2, wherein transistors composing said first series circuit and said second series circuit comprise P-channel MOS transistors, and transistors composing said differential amplifier comprise N-channel MOS transistors.

10. A complementary mixer circuit according to claim 1, wherein each of said transistor pairs has two FET transistors, sources of each pair are coupled with an impedance circuit which is connected in series with the transistor pair, and a drain of said FET transistors is coupled with a respective load circuit.

* * * * *